(12) United States Patent
Shiikuma et al.

(10) Patent No.: US 7,295,064 B2
(45) Date of Patent: Nov. 13, 2007

(54) DOHERTY AMPLIFIER

(75) Inventors: Kazumi Shiikuma, Minato-ku (JP); Junichi Mizoguchi, Minato-ku (JP)

(73) Assignee: NEC Corporation, Tokyo (JP)

( * ) Notice: Subject to any disclaimer, the term of this patent is extended or adjusted under 35 U.S.C. 154(b) by 175 days.

(21) Appl. No.: 10/541,756

(22) PCT Filed: Dec. 17, 2003

(86) PCT No.: PCT/JP03/16183

§ 371 (c)(1),
(2), (4) Date: Jul. 8, 2005

(87) PCT Pub. No.: WO2004/064247

PCT Pub. Date: Jul. 29, 2004

(65) Prior Publication Data

US 2006/0055458 A1    Mar. 16, 2006

(30) Foreign Application Priority Data

Jan. 9, 2003   (JP) ............................... 2003-003137

(51) Int. Cl.
*H03F 3/68* (2006.01)
*H03G 3/20* (2006.01)

(52) U.S. Cl. .................. 330/124 R; 330/136
(58) Field of Classification Search .................. 330/51, 330/124 R, 136
See application file for complete search history.

(56) References Cited

U.S. PATENT DOCUMENTS

| | | | |
|---|---|---|---|
| 5,739,723 A | 4/1998 | Sigmon et al. | |
| 6,128,478 A | 10/2000 | Kim | |
| 6,288,814 B1 | 9/2001 | Blauvelt | |
| 6,356,149 B1 * | 3/2002 | Stengel et al. | ............... 330/107 |

2006/0152279 A1 *  7/2006  Kijima ................... 330/124 R

FOREIGN PATENT DOCUMENTS

| | | |
|---|---|---|
| EP | 1 104 093 A1 | 5/2001 |
| JP | 07-022852 A | 1/1995 |
| JP | 10-513631 A | 12/1998 |
| JP | 2000-513535 A | 10/2000 |
| JP | 2001-518731 A | 10/2001 |
| JP | 2002-124840 A | 4/2002 |
| JP | 2002-510927 A | 4/2002 |
| JP | 2002-368716 A | 12/2002 |
| WO | WO 01/95481 A1 | 12/2001 |

OTHER PUBLICATIONS

W.H. Doherty, "A New High Efficiency Power Amplifier for Modulated Waves", Proceedings of the Institute of Radio Engineers, vol. 24 No. 9, Sep. 1936, pp. 1163-1182.
S. Cripps, "Realization of Doherty Amplifier", RF Power Amplifiers for Wireless Communication, pp. 237-239, Artech House, 1999.
S. Cripps, "Advanced Techniques in RF Power Amplifier" p. 50, Artech House, 2002.
Masamitsu Kawakami, "Electronic Circuits 2", *Kyoritsu Zensho 95*, Kyoritsu Shuppan Co., Ltd., 34th printing (first printing in 1969), pp. 166-169.

* cited by examiner

*Primary Examiner*—Steven J. Mottola
(74) *Attorney, Agent, or Firm*—Sughrue Mion Pllc.

(57) ABSTRACT

The present invention is intended to provide a Doherty amplifier that can accomplish a linear amplifying and a power combining operation closer to the ideal in a simple configuration. The configuration comprises gain compensator 6 that is composed of a parallel circuit made of an anti-parallel diode and a resistor that is disposed at a position ahead of peak amplifier 4 included in the Doherty amplifier. Setting the gain in gain compensator 6 allows peak amplifier 4 to be compensated for the operation characteristic, when peak amplifier 4 is operating, based on the gm characteristic of peak amplifier 4.

6 Claims, 5 Drawing Sheets

DOHERTY AMPLIFIER

TECHNICAL FIELD

The present invention relates to a Doherty amplifier, and more particularly, to a Doherty amplifier, which has a gain compensator that is disposed at a position ahead of a peak amplifier.

BACKGROUND ART

Due to the explosive proliferation of the portable terminal market in recent years and improvements in the infrastructure associated therewith, stricter requirements have been made from the market for improvements in the efficiency of transmission amplifiers for base stations.

In order to respond to the foregoing requirements, attention has been focused in recent years on the trend of attempts to build high-performance and highly efficient amplifiers by combining technology to amplify signals at high efficiency, as represented by the Doherty amplifier, with technology to reduce distortions therefor together with recent distortion compensation technology.

The Doherty amplifier is a device for improving the efficiency of a high-output power amplifier, which was first proposed in Document 1 (W. H. Doherty "A New High Efficiency Power Amplifier for Modulated Waves", Proc.

IRE, Vol. 24, No. 9, September in 1936).

The Doherty amplifier comprises a carrier amplifier for performing an amplifying operation at all times; and a peak amplifier for performing an amplifying operation when high power is generated, specifically, only after the carrier amplifier has reached a saturated maximum output.

In the Doherty amplifier, devices having the same characteristics are generally used for the carrier amplifier and peak amplifier, and they are arranged in parallel. A large number of Doherty amplifiers have been actually implemented as amplifiers to handle signals in frequency bands from low frequencies to millimeter waves.

The example described in Document 2 (JP-7-22852-A) is an example of such a kind of Doherty amplifiers that is conventionally used. FIG. 1 illustrates the Doherty amplifier described in Document 2. In the following, the Doherty amplifier described in Document 2 will be described in brief with reference to FIG. 1.

In FIG. 1, a signal applied from input terminal 1 is distributed to a side of the carrier amplifier and to a side of the peak amplifier by input branching circuit 2, which includes one-quarter wavelength transmission path 21. Carrier amplifier 3 amplifies a signal that is distributed to the carrier amplifier side. A signal distributed to the peak amplifier side is amplified by peak amplifier 4 after it has passed through one-quarter wavelength transmission path 21$f$.

Output combiner circuit 5 includes one-quarter wavelength transmission path 51. Output combiner circuit 5 combines the output of carrier amplifier 3, which has passed one-quarter wavelength transmission path 51, with the output of peak amplifier 4 to deliver the resulting output. Therefore, a phase relationship between output signals of carrier amplifier 3 and peak amplifier 4 is identical at the signal combining point of output combiner circuit 5.

However, if an amplifying operation of carrier amplifier 3 or peak amplifier 4 of the Doherty amplifier differs from an ideal operation, the signal combination, which is performed by output combiner circuit 5, is not performed in an effective manner. For this reason, the Doherty amplifier fails to provide an ideal linear amplifying action and saturated output power.

For example, the foregoing problem occurs when devices having equivalent characteristics (for example, the gm-Id characteristic) are used for a carrier amplifier and a peak amplifier, which make up the Doherty amplifier (classical Doherty). In this event, a problem arises, particularly, in that the operation of the peak amplifier differs from optimum performance. Specifically, a problem occurs in that the gain in the peak amplifier is smaller than a optimum gain.

Therefore, an ideal linear amplifying action or saturated output power cannot be provided even if the carrier amplifier and peak amplifier are identical in the gm (transfer conductance) characteristic (FET's or the like).

Several approaches for addressing this problem have been proposed.

For example, Document 3 (RF Power Amplifiers for Wireless communications, written by Steve C. Cripps, p236, Artech House, 1999) has proposed a technique for controlling the attenuation amount of a variable attenuator, which is disposed on the input side of a peak amplifier, in accordance with the magnitude of the input level in order to compensate for the transfer characteristic.

Also, Document 4 (Advanced Techniques in RF Power Amplifiers written by Steve C. Cripps, P50, Artech House, 2002) has proposed a method of generating maximum power of a Doherty amplifier by appropriately controlling the bias setting of a carrier amplifier from a class-C bias to a class-B bias, in accordance with an input signal level, though no specific block diagram or the like is found therein.

Further, Document 5 (Published Japanese Translation of PCT International Publication for Patent Application No. 2000-513535) has proposed techniques by which a detector directly or indirectly detects the power level of an input signal and the magnitude of the signal, such that bias controllers of a carrier amplifier and a bias amplifier control biases for the carrier amplifier and peak amplifier, respectively, relying on the detected value.

However, whether it be the techniques of Documents 3, 4 or 5, they all requires circuits for making determinations, control and the like, thus leading to a problem that the configuration becomes complicated.

DISCLOSURE OF THE INVENTION

It is an object of the present invention to provide a Doherty amplifier which is capable of accomplishing a linear amplifying and a power combining operation closer to the ideal in a simple configuration, for example, even if the devices with the same characteristics are used as a carrier amplifier and a peak amplifier.

To achieve the above object, a Doherty amplifier according to the present invention has an input terminal, input branching means for distributing the signal applied from the input terminal to a first path and a second path, a carrier amplifier for amplifying the signal distributed to the first path by the input branching means, a peak amplifier for amplifying the signal of a predetermined level or higher among the signals distributed to the second path by the input branching means, output combining means for combining the output of the carrier amplifier with the output of the peak amplifier, and a gain compensator, which is disposed at a position ahead of the peak amplifier in the second path, for changing a gain in accordance with the level of an inputted signal in order to correct the level of the signal distributed to the second path.

The invention described above includes the gain compensator, which is disposed at the position ahead of the peak amplifier in the second path, for changing a gain in accordance with the level of an input signal in order to correct the level of the signal distributed to the second path. Thus, it is possible to compensate for the gain of the peak amplifier by a gain varying operation of the gain compensator. It is therefore possible that circuits, which have been conventionally required for performing detection, determination, control and the like, are unnecessary. Consequently, it is possible to carry out a linear amplifying and a power combining operation closer to the ideal in a simple configuration. Since it is possible that a control circuit, which has been conventionally required, is unnecessary, it is also possible that dedicated control signals and dedicated terminals for the control signals are unnecessary.

Also, in the Doherty amplifier according to the present invention, a gain in the gain compensator, when a signal lower than the predetermined level is applied, is different from a gain in the gain compensator when a signal equal to or higher than the predetermined level is applied.

According to the invention described above, in the gain compensator, the gain, when a signal lower than the predetermined level is applied, is different from the gain when a signal equal to or higher than the predetermined level is applied. Thus, in addition to the aforementioned effects, the peak amplifier can be compensated for the gain when the peak amplifier performs an amplifying operation, without changing the amplifying operation start point of the peak amplifier for a signal applied from the input terminal.

Also, in the gain compensator of the Doherty amplifier according to the present invention, the gain, when the signal equal to or higher than the predetermined level is applied, is larger than the gain when the signal lower than the predetermined level is applied.

According to the present invention described above, in addition to the aforementioned effects, the gain of the peak amplifier can be improved when the peak amplifier performs an amplifying operation, without changing the amplifying operation start point of the peak amplifier for a signal applied from the input terminal. Consequently, when the gain in the peak amplifier is smaller than an optimum gain, the gain in the peak amplifier can be compensated for when the peak amplifier performs an amplifying operation, without changing the amplifying operation start point of the peak amplifier.

Also, in the gain compensator of the Doherty amplifier according to the present invention, the gain, when the signal equal to or higher than the predetermined level is applied, is smaller than the gain when the signal lower than the predetermined level is applied.

According to the invention described above, in addition to the aforementioned effects, the gain of the peak amplifier can be reduced when the peak amplifier performs an amplifying operation, without changing the amplifying operation start point of the peak amplifier for a signal applied from the input terminal. Consequently, when the gain in the peak amplifier is larger than the ideal gain, the gain in the peak amplifier can be compensated for when the peak amplifier performs an amplifying operation, without changing the amplifying operation start point of the peak amplifier.

Also, in the Doherty amplifier according to the present invention, the gain of the gain compensator is set based on the operation characteristic of the peak amplifier. Thus, in addition to the aforementioned effects, the gain in the peak amplifier can be compensated for with high accuracy.

Also, in the Doherty amplifier according to the present invention, the gain compensator is a parallel circuit of an anti-parallel diode and a resistor, or a parallel circuit of a diode and a resistor, or an FET, or a bipolar transistor. Thus, in addition to the aforementioned effects, a simple configuration can be used to implement the gain compensator.

Also, in the Doherty amplifier according to the present invention, the carrier amplifier and peak amplifier are each composed of an FET, and the gain compensator compensates for the gm characteristic of the peak amplifier.

According to the invention described above, even when the carrier amplifier and peak amplifier are composed of FET's, it is possible to provide effects similar to the aforementioned effects.

BRIEF DESCRIPTION OF THE DRAWINGS

FIG. 7 is a characteristic diagram showing the characteristic of the gain compensator illustrated in FIG. 3a;

BEST MODE FOR CARRYING OUT THE INVENTION

In the following, embodiments of the present invention will be described with reference to the drawings.

Figure 1:
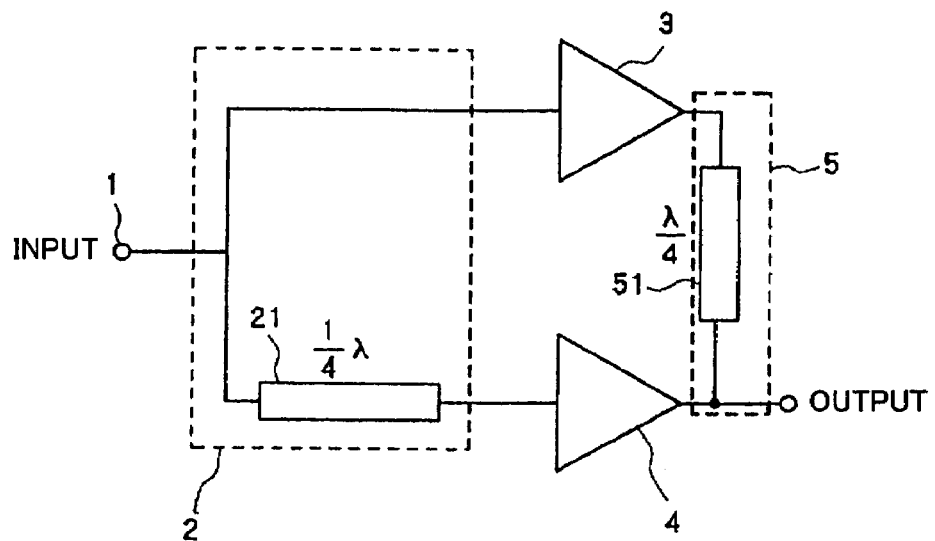
FIG. 1 is a block diagram illustrating a conventional Doherty amplifier.
Figure 2:
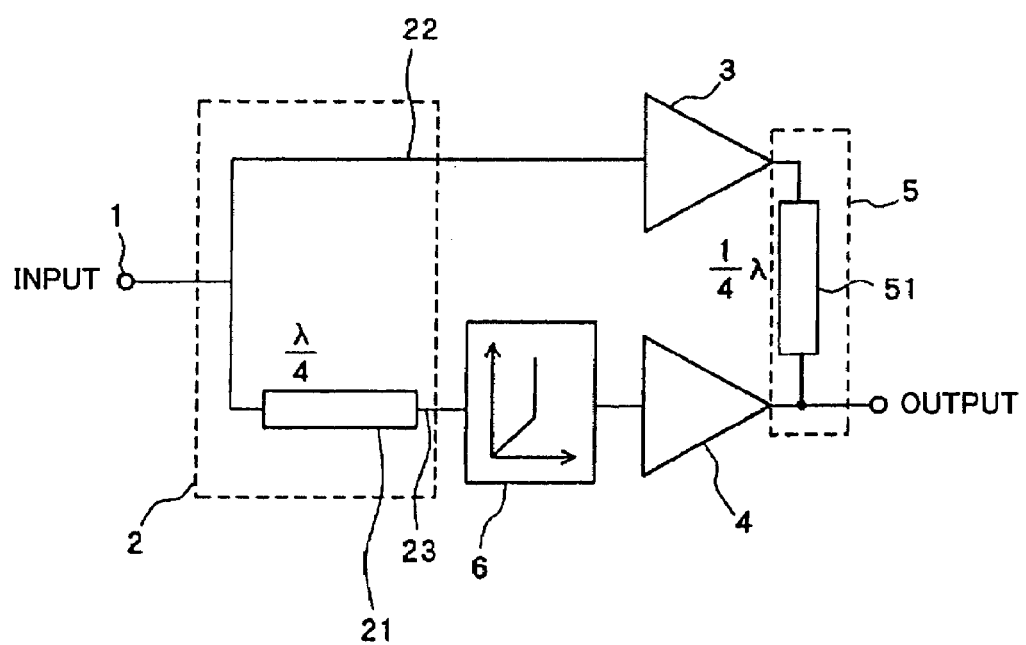
FIG. 2 is a block circuit diagram illustrating one embodiment of the present invention.

One feature of this embodiment is that gain compensator 6 is disposed at a position ahead of peak amplifier 4, as illustrated in FIG. 2, in a Doherty amplifier that includes carrier amplifier 3 and peak amplifier 4. In FIG. 2, a gain compensator, as a correcting means, has a gain that varies in accordance with an input level. Note that in FIG. 2, those identical in configuration to those illustrated in FIG. 1 are designated with the same reference numerals.

This embodiment will be summarized here.

In the Doherty amplifier of this embodiment, gain compensator 6, whose gain varies in accordance with an input level, is disposed in a conventional configuration which comprises carrier amplifier 3, peak amplifier 4, output combiner 5, and input branching circuit 2, as illustrated in FIG. 1. Specifically, as illustrated in FIG. 2, gain compensator 6 is disposed at a position ahead of peak amplifier 4.

In this embodiment, when the level of an input signal is equal to or higher than an amplification start level of peak amplifier 4 which is biased, for example, to class C and composed of FET, gain compensator 6 makes a correction such that it increases the gate input voltage signal of peak amplifier 4.

By using gain compensator 6 as described above, even in a Doherty amplifier has peak amplifier 4 and carrier amplifier 3 that have the same characteristics, the Doherty amplifier can operate to generate a desired maximum output at the time of a saturated output. It is therefore possible to achieve optimum amplifying performance as a Doherty amplifier.

In the following, the Doherty amplifier of this embodiment will be described specifically with reference to FIG. 2.

This Doherty amplifier has amplifier 3, generally called a "carrier amplifier," which amplifies a signal at all times; and amplifier 4, generally called a "peak amplifier" or an "auxiliary amplifier (in this specification, the "peak amplifier" is always used), which operates only when a signal having a predetermined level or higher is applied (only when high power is generated).

The predetermined level corresponds to the level of a signal that is applied from input terminal 1 when carrier amplifier 3 starts generating saturated output power. In this embodiment, the predetermined level is set at the level of a signal applied from input terminal 1 when carrier amplifier 3 starts generating the saturated output power.

Gain compensator 6 is disposed at a position ahead of peak amplifier 4 to compensate for an amplitude component of peak amplifier 4 in accordance with the transfer characteristic (operation characteristic) of peak amplifier 4.

Further, this Doherty amplifier includes output combiner circuit 5 as an output combining means for combining the output of carrier amplifier 3 with the output of peak amplifier 4 in order to deliver the combined output; and input branching circuit 2 as an input branching means for distributing an input signal to carrier amplifier 22 (first path) and the side of peak amplifier 23 (second path).

Generally, a Doherty amplifier has carrier amplifier 3 that operates while maintaining saturation near the saturated output power. Thus, the Doherty amplifier accomplishes a higher efficiency than general class-A and class-AB amplifiers even when a backoff is removed from the saturated power for delivery.

Generally, an amplifier, which is biased to class AB or class B, is often used as carrier amplifier 3. Generally, peak amplifier 4 is often biased to class C for use such that it operates only when a high-power signal is generated.

Output combiner circuit 5, which combines the output of carrier amplifier 3 with the output of peak amplifier 4, is composed, for example, of a transformer, and generally comprises one-quarter wavelength transmission line 51. Input branching circuit 2 includes one-quarter wavelength transmission line 21 or a 90° hybrid circuit or the like for making a wave relationship between an output signal of peak amplifier 4 and an output signal of carrier amplifier 3 that is identical in pattern at a signal combining point of output combiner circuit 5.

Figure 3A:
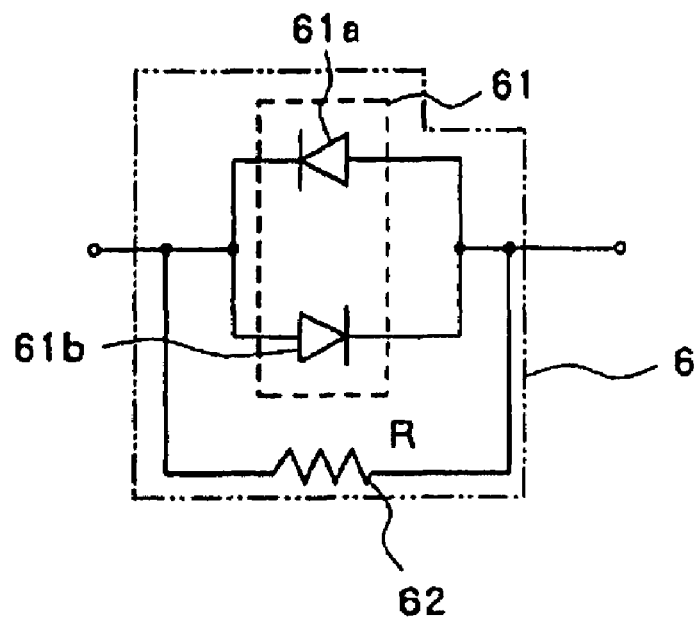
FIG. 3a is a circuit diagram illustrating an example of gain compensator 6.

Also, gain compensator 6 of FIG. 2 is composed of anti-parallel diode 61 and resistor 62, for example, as illustrated in FIG. 3a.

Specifically, a parallel circuit of anti-parallel diode 61 and resistor 62 may be used as gain compensator 6. Anti-parallel diode 61 is composed of diode 61a and diode 61b. Diode 61a has a cathode that is connected to one-quarter wavelength transmission line 21 of input branching circuit 2, and a cathode that is connected to the input side of peak amplifier 4. Diode 61b has a cathode that is connected to the anode of diode 61a, and an anode that is connected to the cathode of diode 61a.

Because the operation principles of the general Doherty amplifier are well known by those skilled in the art, for example, from documents such as Advanced Techniques in RF Power Amplifiers, Artech House 2002 written by Steve C. Cripps, detailed description thereon is omitted.

In the following, the operation of this embodiment will be described.

For simplifying the description, this embodiment employs carrier amplifier 3, which is biased to class B, and peak amplifier 4, which is biased to class C, and employs FET devices of the same characteristics as carrier amplifier 3 and peak amplifier 4. The operation of this Doherty amplifier will be described below. However, the present invention is not limited to the foregoing configuration, but can be modified as appropriate.

At first, the operating states of respective amplifiers 3, 4, in which the Doherty amplifier achieves optimum performance, will be described with reference to FIG. 4.

The operation of the Doherty amplifier is roughly divided into three operation regions, specifically, a low level region, a transition region, and a saturation region.

Figure 4:
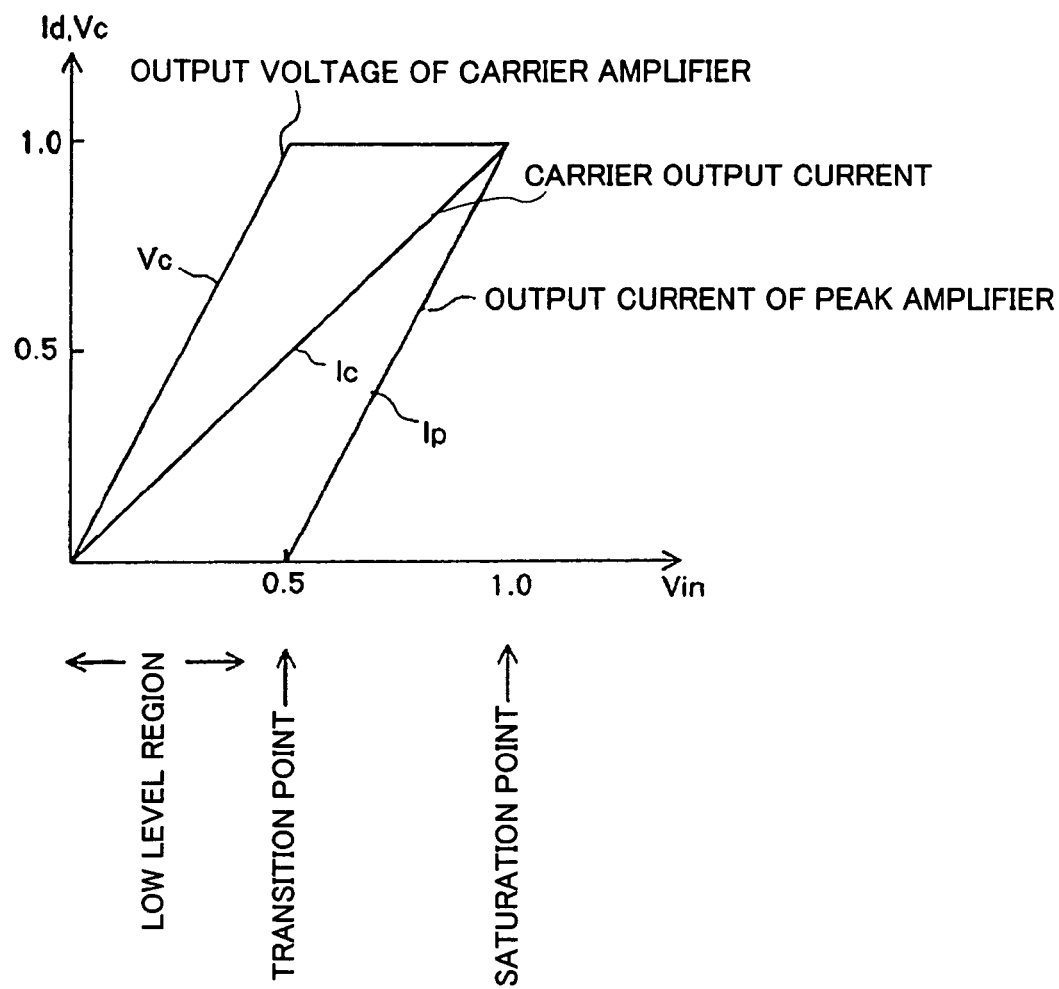
FIG. 4 is an explanatory diagram for describing operating states of amplifiers 3 and 4 during an ideal operation of the Doherty amplifier.

In FIG. 4, the horizontal axis represents input voltage Vin, which indicates a maximum value of an input voltage, which is applied to each of carrier amplifier 3 and peak amplifier 4, as 1, and the vertical axis represents a drain current of peak amplifier 4 as Ip, an output voltage of carrier amplifier 3 as Vc, and a drain current of carrier amplifier 3 as Ic.

In this embodiment, assume that FET's of the same characteristics are used as carrier amplifier 3 and peak amplifier 4. For this reason, a maximum value of Ic and a maximum value of Ip are shown to be equal. Also, peak amplifier 4, which is a component of a normal Doherty amplifier, is biased to class C, and starts an amplifying operation only after the drain current starts flowing from input voltage Vin that is 0.5.

Figure 5:
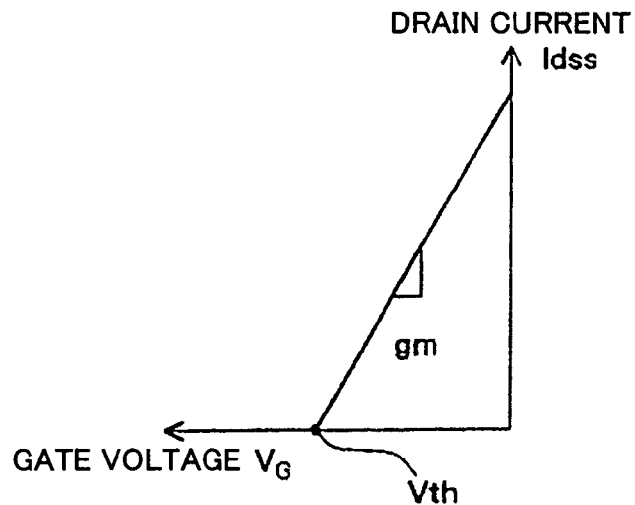
FIG. 5 is a characteristic diagram showing the drain current—gate voltage characteristics of carrier amplifier 3 and peak amplifier 4.

Also, for the drain current gate voltage characteristics of the respective devices, specifically, carrier amplifier 3 and peak amplifier 4, assume that the drain current starts flowing from threshold voltage Vth, as shown in FIG. 5, and transfer conductance gm has a constant value.

When signal Vin at a level equal to or lower than a predetermined level (Vin=0.5 in this example) is applied to carrier amplifier 3 that is biased to class B, output voltage Vc of carrier amplifier 3 is generated in proportion to signal Vin. In this event, a region over which output voltage Vc of carrier amplifier 3 varies in accordance with signal Vin, defines the low level region.

Next, when signal Vin reaches 0.5 (this is called the "transition point"), carrier amplifier 3 is saturated, so that the output voltage becomes a constant value. At this time, the efficiency of the Doherty amplifier itself is maximized, where the efficiency ideally reaches 78% ($\pi/4$) which is an ideal efficiency of a class-B amplifier. However, the saturated output power of carrier amplifier 3 at this time is one quarter of the saturated power that should be generated as the Doherty amplifier.

When Vin increases from this transition point, peak amplifier 4 also starts operating.

With this operation of peak amplifier 4, a load impedance of carrier amplifier 3 modulates through transmission transformer 51 of output combiner circuit 5. As a result, the output current of carrier amplifier 3 increases linearly in accordance with the input voltage, so that a load is supplied with larger power. As a result, in the Doherty amplifier, a linear amplification characteristic is maintained. Consequently, the Doherty amplifier can linearly amplify the power.

When the input voltage further increases, peak amplifier 4 also reaches saturation. As a result, a saturated maximum output is generated as the Doherty amplifier. For the time period from this transition point to a saturation point, the total efficiency of the Doherty amplifier is maintained extremely high.

The foregoing operation is an example of an ideal operation of the Doherty amplifier.

In this event, the drain current of peak amplifier 4 must increase in proportion to the input voltage, which is higher than the transition point, with a slope twice as large as the slop of an increase in the drain current of carrier amplifier 3. In this event, when the input voltage finally reaches a peak (Vin=1.0), the drain current (Ic) of carrier amplifier 3 and the drain current (Ip) of peak amplifier 4 are maximized (Ic=Ip=1.0). Consequently, the load impedance, which is viewed from carrier amplifier 3, is also in an optimal state in which the maximum output can be transferred to the load, so that the maximum output of the Doherty amplifier can be generated.

Next, a description will be given of an actual operation of the Doherty amplifier.

When the Doherty amplifier is actually designed, devices having substantially the same characteristics are often used for carrier amplifier 3 and peak amplifier 4. This is a configuration called "classical Doherty."

For example, when the saturated power of a Doherty amplifier is set at 100 W, the devices with the same characteristics, the saturated power of which is 50 W, are used as a carrier amplifier and a peak amplifier. Of course, instead of this, a configuration called "extended Doherty" may be used, in which the devices differ in saturated power. However, because the basic principles are the same, description and the like for that case are omitted.

However, when a Doherty amplifier is made up by using devices which have the same characteristics as a carrier amplifier and a peak amplifier as described above, ideal characteristics of the Doherty amplifier cannot be accomplished just by simply combining the carrier amplifier with the peak amplifier, having the same characteristics, as illustrated in FIG. 1 as the prior art. For this reason, a lower coefficient, lower saturated power, and degraded linearity will result near the saturated power.

Figure 6:
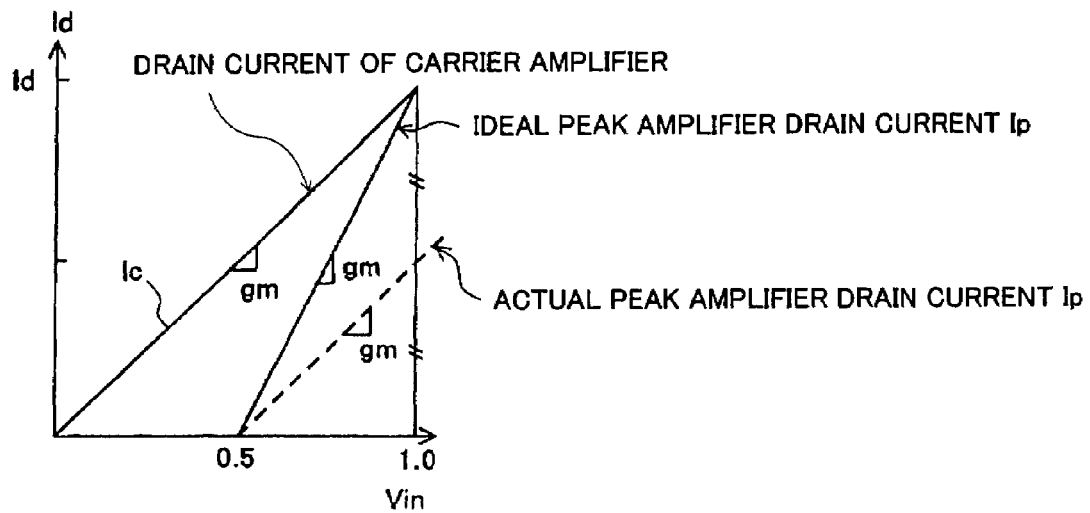
FIG. 6 is an explanatory diagram illustrating an operating state of the Doherty amplifier.

FIG. 6 is a diagram showing an example of the degradation which occurs in an actual Doherty amplifier, showing the input/output characteristics of main parameters similar to the ideal state shown in FIG. 4.

As described above, in the ideal state, the current of peak amplifier 4 must reach the maximum value at the maximum point of the input voltage. Contrary to this, in the example shown in FIG. 6, transfer conductance gm is only one-half of a value required as an ideal value. Thus, even if the input voltage is maximized, the drain current merely reaches one-half of an ideal value.

For this reason, an ideal operation of the Doherty amplifier fails. According to a simple calculation, the drain efficiency at the maximum input is 58.9%, which is about 20% lower than 78% that occurs in the ideal state, the output decreases to 50% of the ideal state, and the input/output linearity degrades to the output level that is 0.5 when the input is 1.

Thus, in the present invention, a Doherty amplifier that operates at optimum performance can be implemented by disposing a gain compensator, the gain of which varies in accordance with the magnitude of an input signal, as an example illustrated in FIG. 3a, at a position ahead of peak amplifier 4. For example, even if devices that have the same characteristics are used as carrier amplifier 3 and peak amplifier 4, the resulting product can operate as an ideal Doherty amplifier.

Figure 3B:
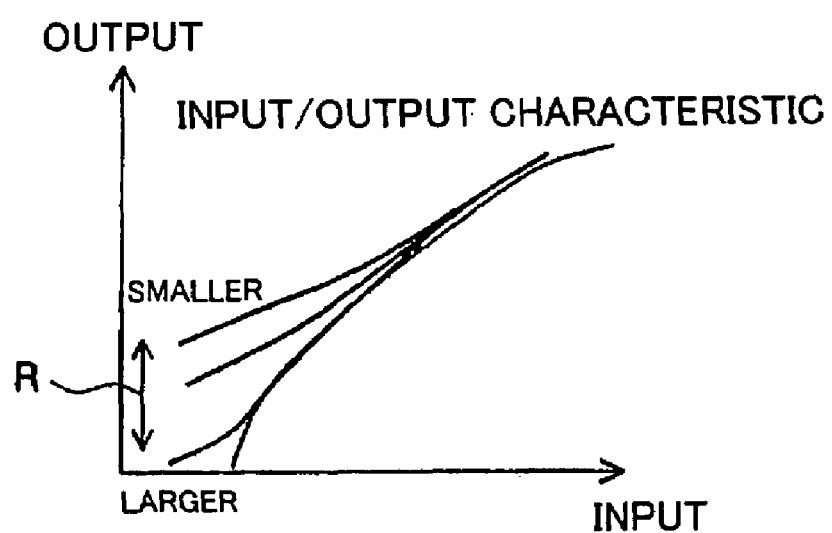
FIG. 3b is an explanatory diagram showing a characteristic of gain compensator 6.
Figure 7:
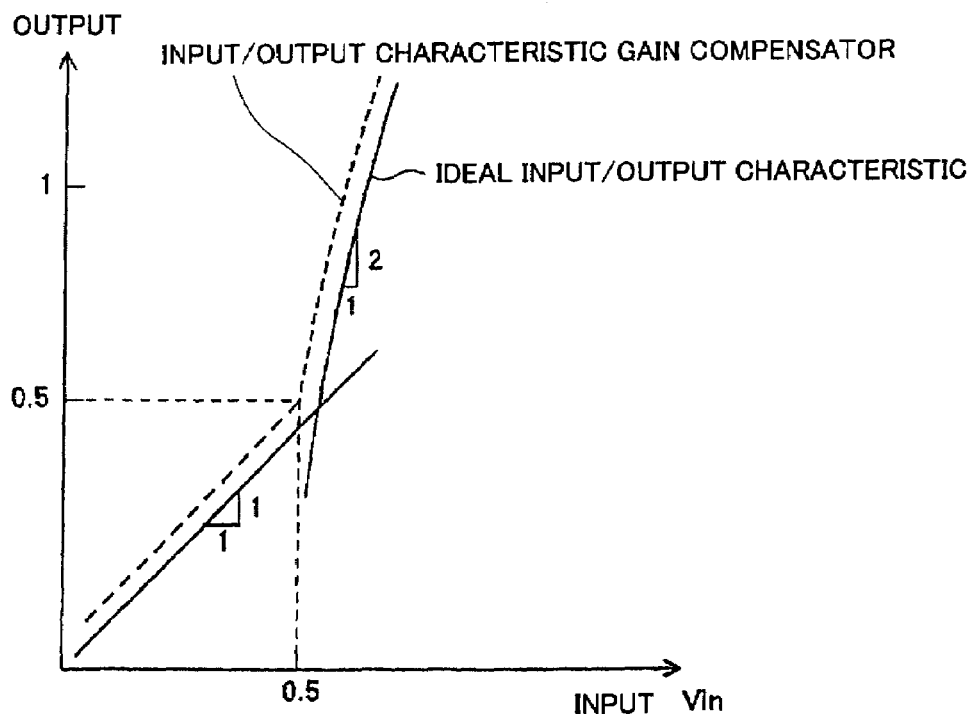

In the case of this embodiment, specifically, the characteristics of gain compensator 6 shown in FIG. 3b may be set such that the output signal increases substantially by a factor of two in response to an increase by one of the input signal when signal Vin is at 0.5 or more, as shown in FIG. 7.

The characteristics as mentioned above can be approximately accomplished by selecting appropriate diodes 61a, 61b and peripheral resistor 62 in the exemplary circuit as illustrated in FIG. 3a. For example, as a large resistance value is selected, an output range characteristic is shown in which the input/output characteristic with a large slope occupies a larger proportion, and conversely, as a small resistance value is selected, an output range characteristic is shown in which the input/output characteristic with a large slope occupies a smaller proportion.

Consequently, when this gain compensator 6 is disposed at a position ahead of peak amplifier 4, and when the input level to gain compensator 6 and an operating state are set such that the output range start point of gain compensator 6 is positioned near the threshold voltage (Vin=0.5) of peak amplifier 4 or at the threshold voltage (Vin=0.5) of peak amplifier 4, the gm characteristic of peak amplifier 4 can be apparently doubled, making use of a region in which the slope of the input/output characteristic is approximately two.

Stated another way, peak amplifier 4 has a maximum drain current at the time that the input level reaches the maximum value. Therefore, it is possible to accomplish an ideal state of the Doherty amplifier from the transition point to the saturated state. As such, even if the devices with the same characteristics, for example, are used for the carrier amplifier and peak amplifier, it is possible to implement a Doherty amplifier that can present a linear amplifying and a power combining operation closer to the ideal in a simple configuration.

Describing in greater detail, in the case of this example, the input level to or the operating state of gain compensator 6 is set such that the gain of gain compensator 6, i.e., the slope of the input/output characteristic of gain compensator 6 is one or substantially one when the level of a signal applied to input terminal 1 is equal to or lower than the threshold voltage of peak amplifier 4, and the gain of gain compensator 6, i.e., the slope of the input/output characteristic of gain compensator 6 is two or substantially two when the level of the signal applied to input terminal 1 exceeds the threshold voltage of peak amplifier 4. It is therefore possible to operate peak amplifier 4 in an ideal state.

As described above, gain compensator 6, the gain of which varies in accordance with the level of an input signal, is disposed at the position ahead of peak amplifier 4. Thus, it is possible to compensate for the gain during the operation of the peak amplifier by a gain varying operation of gain compensator 6. Also, it is possible to avoid an unintended operation of peak amplifier 4 when there is no need for the peak amplifier to operate (in a state where the level of a signal, which is applied to input terminal 1, is below the predetermined level).

Supplementing this aspect, assume, for example, that the gain in gain compensator 6 is fixed at a gain to compensate for peak amplifier 4 during its operation, then peak amplifier 4 can unexpectedly operate even in a state where peak amplifier 4 should essentially not operate (in the state where the level of a signal applied to input terminal 1 is below the predetermined level).

On the contrary, in this embodiment, gain compensator 6, the gain of which varies in accordance with the level of an input signal, is disposed at a position ahead of peak amplifier 4. Thus, the gain of gain compensator 6 can be modified such that this gain goes to a gain at which the output of gain compensator 6 is below the predetermined value at which peak amplifier 4 should essentially not operate (in the state where the level of a signal applied to input terminal 1 is below the predetermined level), and the gain of gain compensator 6 provides a gain which compensates the peak amplifier in the state where the level of a signal applied to input terminal 1 is the same or higher than the predetermined level. It is therefore possible to perform a linear amplifying and a power combining operation closer to the ideal in a simple configuration as described above.

Also, because the gain of gain compensator 6, when a signal that is lower than the predetermined level is applied from input terminal 1, is set different from the gain of gain compensator 6 when a signal that is equal to or higher than the predetermined level is applied, the linear amplifying and power combining operations closer to the ideal can be performed in a simple configuration, as described above, without changing the amplifying operation start point of peak amplifier 4 (the threshold voltage of peak amplifier 4) for the signal applied from input terminal 1.

Also, when the gain of gain compensator 6, when a signal equal to or higher than the predetermined level, is larger than the gain of gain compensator 6 when a signal lower than the predetermined level is applied, the gain of the peak amplifier, when the peak amplifier performs an amplifying operation, can be increased to an ideal gain without changing the amplifying operation start point of the peak amplifier for the signal applied from the input terminal, if the gain of peak amplifier 4 is below the ideal value.

As well, the gain of gain compensator 6 is set based on the operation characteristic of peak amplifier 4. Thus, in addition to the aforementioned effects, the gain of peak amplifier 4 and/or the amplifying operation start point of peak amplifier 4 (the threshold voltage in this example) can be compensated for with high accuracy.

In the foregoing, an example has been shown for the case where transfer conductance gm of peak amplifier 4 is just one-half as much as a value that would be required as an ideal value, and an example has been shown for the case where the slope of the input/output characteristic of gain compensator 6 is set to two or approximately two as the gain compensation of gain compensator 6, when signal Vin is equal to or more than 0.5. However, the gain compensation of gain compensator 6 when signal Vin is equal to or more than 0.5 can be changed as appropriate depending on the ratio of transfer conductance gm of peak amplifier 4 to the ideal value.

For example, when transfer conductance gm of peak amplifier 4 is larger than the value required as the ideal value, the slope of the input/output characteristic of gain compensator 6 may be set to one or approximately one, as the gain compensation of gain compensator 6, if signal Vin is less than 0.5. On the other hand, if signal Vin is equal to or more than 0.5, the slope of the input/output characteristic of gain compensator 6 may be reduced to less than one, as the gain compensation of gain compensator 6.

As described above, when using gain compensator 6, whose gain is smaller, when a signal equal to or higher than a predetermined level is applied, than the gain, when a signal lower than the predetermined level is applied, the gain of the peak amplifier can be reduced when the peak amplifier performs an amplifying operation, without changing the amplifying operation start point of the peak amplifier to the signal that is applied from the input terminal. Thus, when the gain of the peak amplifier is larger than the ideal gain, the peak amplifier can be compensated for this gain when the peak amplifier performs an amplifying operation, without changing the amplifying operation start point of the peak amplifier.

Also, the gain compensator is not limited to the configuration illustrated in FIG. 3a, but can be modified as appropriate. For example, gain compensator 6 can also be implemented by a simple circuit as illustrated in FIG. 9 which has characteristics as described above.

Figure 9A:
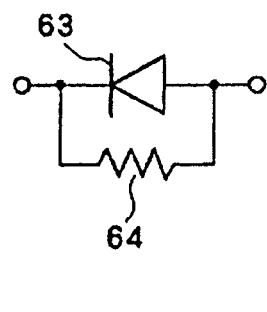
FIG. 9a is a circuit diagram illustrating another example of the gain compensator.
Figure 9B:
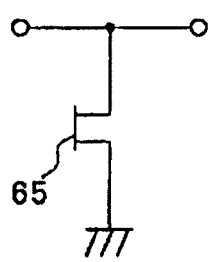
FIG. 9b is a circuit diagram illustrating another example of the gain compensator.
Figure 9C:
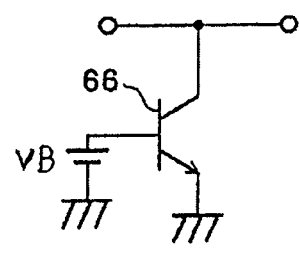
FIG. 9c is a circuit diagram illustrating another example of the gain compensator.

FIG. 9 will be described in brief. FIG. 9a is a diagram illustrating an example in which a parallel circuit of diode 63 and resistor 64 are used as gain compensator 6. In FIG. 9a, diode 63 has a cathode that is connected to one-quarter wavelength transmission line 21 of input branching circuit 2, and diode 63 has an anode that is connected to the input side of peak amplifier 4. FIG. 9b is a diagram illustrating an example in which FET 65 is used as gain compensator 6. In FIG. 9b, FET 65 has a drain that is connected to second path 23, and the FET has a grounded source. FIG. 9c illustrates an example in which bipolar transistor 66 is used as gain compensator 6. In FIG. 9c, bipolar transistor 66 has a collector that is connected to second path 23, bipolar transistor 66 has a grounded emitter, and desired voltage VB is applied to the base of bipolar transistor 66.

Figure 8:
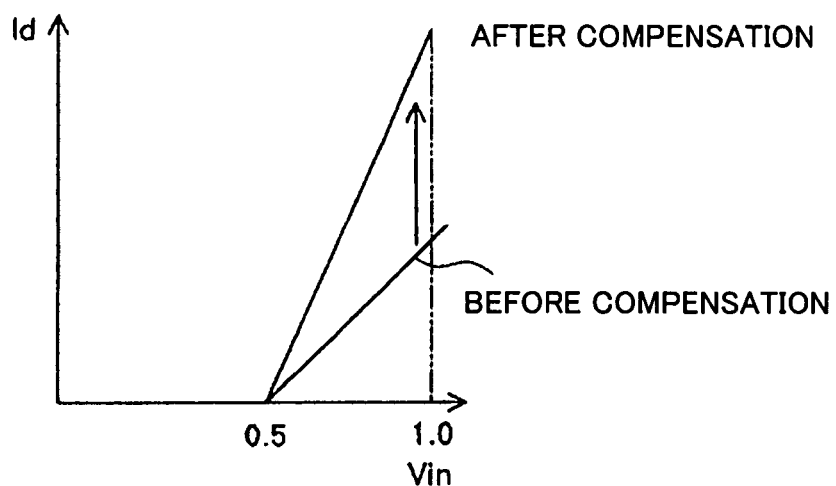
FIG. 8 is an explanatory diagram showing an example of compensation by the gain compensator in accordance with the peak amplifier.

Also, the concept of the present invention can be readily extended to amplifiers having different saturated current characteristics of devices that are used for peak amplifier 4 and carrier amplifier 3. For example, even when devices, which differ in source voltage or saturated current characteristic, are used as peak amplifier 4 and carrier amplifier 3, an approach substantially identical to the foregoing can be basically employed, by taking into consideration of the input/output characteristic which is normalized by a maximum value, as described above. To give a specific illustration, as shown in FIG. 8, a slope of the peak amplifier, from a class-C bias point to an operating current value, in which the desired saturated output power can be generated, may be corrected by the gain compensator using a desired value. In particular, a slope of the peak amplifier, from its amplifying operation start point (for example, the threshold voltage) to the operating current value in which the desired saturated output power can be generated, for example, the gm characteristic, may be corrected by the gain compensator using a desired value.

Therefore, even when devices, which have different characteristics from each other, are used as carrier amplifier 3 and peak amplifier 4, it is possible to implement a Doherty amplifier which provides a linear amplifying and a power combining operation close to the ideal in a simple configuration.

In the present invention, the gain compensator, whose gain varies in accordance with the level of an input signal, is disposed at a position ahead of the peak amplifier of the Doherty amplifier. It is therefore possible to perform an ideal amplifying operation at optimum performance without requiring a complicated circuit configuration and control for performing detection, determination, control and the like, as is the case with the prior art. Consequently, it is possible to simplify the configuration and reduce the cost even when the devices with the same characteristics, for example, are used as the carrier amplifier and peak amplifier.

In the embodiment described above, the illustrated configurations are mere examples, and the present invention is not limited to the configurations.

The invention claimed is:

1. A Doherty amplifier comprising:

an input terminal;

input branching circuit for distributing a signal applied from said input terminal to a first path and a second path;

a carrier amplifier for amplifying a signal distributed to the first path by said input branching circuit;

a peak amplifier for amplifying a signal of a predetermined level or higher among signals distributed to the second path by said input branching circuit;

output combining circuit for combining an output of said carrier amplifier with an output of said peak amplifier; and a gain compensator disposed at a position ahead of said peak amplifier in the second path for changing a gain in accordance with the level of an input signal in order to correct the level of the signal distributed to the second path, said carrier amplifier and said peak amplifier being devices having the same characteristics, said peak amplifier having a gain smaller than an ideal gain, wherein said gain compensator has a larger gain, when a signal equal to or higher than the predetermined level is applied, than a gain when a signal lower than the predetermined level is applied, said gain being set based on a transfer conductance of said peak amplifier, and said gain compensator comprises a parallel circuit comprising an anti-parallel diode and a resistor, or a parallel circuit comprising a diode and a resistor, or a FET, or a bipolar transistor.

2. The Doherty amplifier according to claim 1, wherein said carrier amplifier and said peak amplifier are each composed of an FET, and said gain compensator compensates said peak amplifier for a gm characteristic.

3. A Doherty Amplifier of claim 1 wherein:

said input branching circuit includes a one-quarter wavelength transmission path.

4. A Doherty Amplifier of claim 1 wherein:

said output combining circuit includes a one-quarter wavelength transmission path.

5. An amplifier comprising:

a carrier amplifier for amplifying a first signal derived from an input signal;

a peak amplifier for amplifying a second signal derived from the input signal;

an output terminal outputting a third signal obtained by combining an output of said carrier amplifier with an output of said peak amplifier; and a gain compensator disposed at a position ahead of said peak amplifier for changing a gain in accordance with the level of the input signal, said carrier amplifier and said peak amplifier are devices having a substantially similar gain characteristic, said peak amplifier having a gain smaller than an ideal gain, wherein said gain compensator has a larger gain, when a signal equal to or higher than the predetermined level is applied, than a gain when a signal lower than the predetermined level is applied, said gain being set based on a transfer conductance of said peak amplifier, and said gain compensator comprises a parallel circuit composed of an anti-parallel diode and a resistor, or a parallel circuit composed of a diode and a resistor, or an FET, or a bipolar transistor.

6. The amplifier according to claim 5, wherein said carrier amplifier and said peak amplifier each comprise a FET, and said gain compensator compensates said peak amplifier for a gm (transfer conductance) characteristic.

* * * * *